US011211100B2

(12) United States Patent
Luo et al.

(10) Patent No.: US 11,211,100 B2
(45) Date of Patent: *Dec. 28, 2021

(54) RECOVERY OF MEMORY FROM ASYNCHRONOUS POWER LOSS

(71) Applicant: Micron Technology, Inc., Boise, ID (US)

(72) Inventors: Xiangang Luo, Fremont, CA (US); Jianmin Huang, San Carlos, CA (US); Patroclo Fumagalli, Carate Brianza (IT); Scott Anthony Stoller, Boise, ID (US); Alessandro Magnavacca, Sesto San Giovanni (IT); Andrea Pozzato, Paderno Dugnano (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/122,531

(22) Filed: Dec. 15, 2020

(65) Prior Publication Data

US 2021/0098030 A1      Apr. 1, 2021

Related U.S. Application Data

(63) Continuation of application No. 16/555,508, filed on Aug. 29, 2019, now Pat. No. 10,872,639.

(60) Provisional application No. 62/787,077, filed on Dec. 31, 2018.

(51) Int. Cl.
| *G11C 5/14* | (2006.01) |
| *G11C 29/38* | (2006.01) |
| *G11C 11/4099* | (2006.01) |
| *G06F 11/07* | (2006.01) |

(52) U.S. Cl.
CPC ............ *G11C 5/144* (2013.01); *G06F 11/076* (2013.01); *G06F 11/079* (2013.01); *G11C 11/4099* (2013.01); *G11C 29/38* (2013.01)

(58) Field of Classification Search
CPC ... G11C 5/144; G11C 11/4099; G06F 11/076; G06F 11/079
See application file for complete search history.

(56) References Cited

U.S. PATENT DOCUMENTS

| 8,250,417 | B2 | 8/2012 | Feeley et al. |
| 9,478,271 | B2 | 10/2016 | Chen et al. |
| 9,728,278 | B2 | 8/2017 | Muchherla et al. |
| 9,921,898 | B1 | 3/2018 | Miller et al. |
| 10,121,551 | B1 | 11/2018 | Miller et al. |

(Continued)

FOREIGN PATENT DOCUMENTS

CN      111381778 A     7/2020

OTHER PUBLICATIONS

U.S. Appl. No. 16/555,508, U.S. Appl. No. 10/872,639, filed Aug. 29, 2019, Recovery of Memory From Asynchronous Power Loss.

(Continued)

*Primary Examiner* — Tri M Hoang
(74) *Attorney, Agent, or Firm* — Schwegman Lundberg & Woessner, P.A.

(57) ABSTRACT

Systems and methods are disclosed, including determining whether to write dummy data to a first physical page of memory cells of a storage system, such as in response to a detected asynchronous power loss (APL) at the storage system, using a determined number of zeros in the first physical page.

20 Claims, 6 Drawing Sheets

(56) References Cited

U.S. PATENT DOCUMENTS

| | | |
|---|---|---|
| 10,303,535 B2 | 5/2019 | Miller et al. |
| 10,318,416 B2 | 6/2019 | White |
| 10,325,670 B2 | 6/2019 | Luo et al. |
| 10,872,639 B2 * | 12/2020 | Luo ................ G11C 5/144 |
| 2015/0113237 A1 | 4/2015 | Kim |
| 2015/0127887 A1 | 5/2015 | Kim et al. |
| 2018/0330793 A1 | 11/2018 | Tang et al. |
| 2019/0065108 A1 | 2/2019 | Miller et al. |
| 2019/0155744 A1 | 5/2019 | Srinivasan et al. |
| 2020/0075114 A1 | 3/2020 | Lin |
| 2020/0211603 A1 | 7/2020 | Luo et al. |

OTHER PUBLICATIONS

"Chinese Application Serial No. 201911411665.0, Voluntary Amendment Filed Oct. 22, 20", w/ English Claims, 18 pgs.

* cited by examiner

RECOVERY OF MEMORY FROM ASYNCHRONOUS POWER LOSS

CLAIM OF PRIORITY

This application is a continuation of U.S. Application Ser. No. 16/555,508, filed Aug. 29, 2019, now issued as U.S. Pat. No. 10,872,639, which claims the benefit of priority to U.S. Application Ser. No. 62/787,077, filed Dec. 31. 2018, each of which are incorporated herein by reference in their entireties.

TECHNICAL FIELD

Embodiments of the disclosure relate generally to memory management and more specifically to recovery of one or more memory components from asynchronous power loss.

BACKGROUND

Memory devices are semiconductor circuits that provide electronic storage of data for a host system (e.g., a computer or other electronic device). Memory devices may be volatile or non-volatile. Volatile memory requires power to maintain data, and includes devices such as random-access memory (RAM), static random-access memory (SRAM), dynamic random-access memory (DRAM), or synchronous dynamic random-access memory (SDRAM), among others. Non-volatile memory can retain stored data when not powered, and includes devices such as flash memory, read-only memory (ROM), electrically erasable programmable ROM (EEPROM), erasable programmable ROM (EPROM), resistance variable memory, such as phase change random access memory (PCRAM), resistive random-access memory (RRAM), or magnetoresistive random access memory (MRAM), among others.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
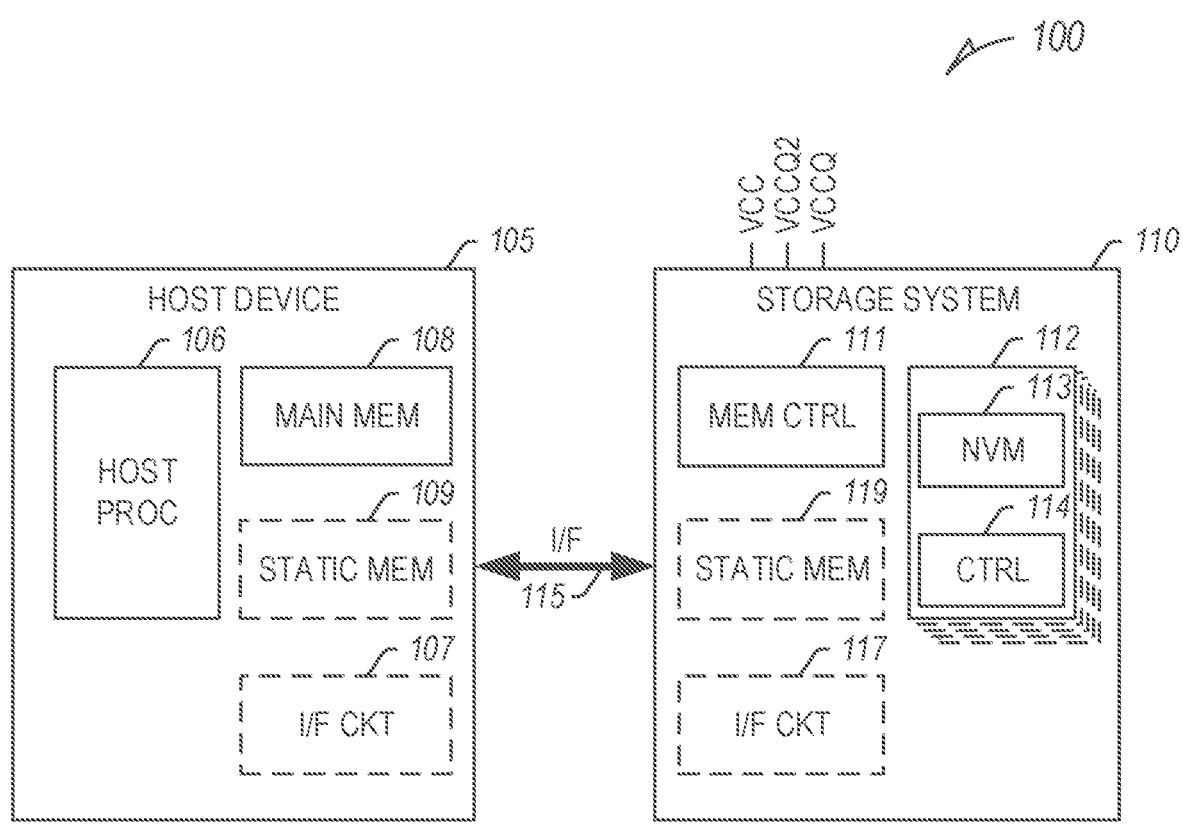
FIG. 1 illustrates an example host system including a host device and a storage system.

Systems and methods are disclosed, including determining whether to write dummy data to a first physical page of memory cells of a storage system, such as in response to a detected asynchronous power loss (APL) at the storage system, using a determined number of zeros in the first physical page.

Memory devices include individual memory die, which may, for example, include including a storage region comprising one or more arrays of memory cells, implementing one (or more) selected storage technologies. Such memory die will often include support circuitry for operating the memory array(s). Other examples, sometimes known generally as "managed memory devices," include assemblies of one or more memory die associated with controller functionality configured to control operation of the one or more memory die. Such controller functionality can simplify interoperability with an external device, as a "host" as discussed later herein.

In such managed memory devices, the controller functionality may be implemented on one or more die also incorporating a memory array, or on a separate die). In other examples, one or more memory devices may be combined with controller functionality to form a solid-stage drive (SSD) storage volume.

Embodiments of the present disclosure are described in the example of managed memory devices implementing NAND flash memory cells, termed "managed NAND" devices. These examples, however, are not limiting on the scope of the disclosure, which may be implemented in other forms of memory devices and/or with other forms of storage technology.

NAND flash architecture semiconductor memory arrays (such a NAND memory die) are accessed through decoders that activate specific memory cells by selecting the word line coupled to their gates. In a NAND architecture semiconductor memory array, a high bias voltage is applied to a drain-side select gate (SGD) line. Word lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows from the source line to the bit line through each series coupled group, restricted only by the selected memory cells of each group, placing current encoded data values of selected memory cells on the bit lines.

Each flash memory cell NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC can refer to a memory cell that can store two bits of data per cell (e.g., one of four programmed states), a triple-level cell (TLC) can refer to a memory cell that can store three bits of data per cell (e.g., one of eight programmed states), and a quad-level cell (QLC) can store four bits of data per cell. MLC is used herein in its broader context, to refer to any memory cell(s) that can store more than one bit of data per cell (i.e., that can represent more than two programmed states).

Managed memory devices may be configured and operated in accordance with recognized industry standards. For example, managed NAND devices may be (as non-limiting examples), a Universal Flash Storage (UFS™) device, or an embedded MMC device (eMMC™), etc. For example, in the case of the above examples, UFS devices may be configured in accordance with Joint Electron Device Engineering Council (JEDEC) standards (e.g., JEDEC standard JESD223D, entitled "JEDEC UFS Flash Storage 3.0," and/or updates or subsequent versions to such standard. Similarly, identified eMMC devices may be configured in accordance with JEDEC standard JESD84-A51, entitled "JEDEC eMMC standard 5.1", again, and/or updates or subsequent versions to such standard.

An SSD can be used as, among other things, the main storage device of a computer, having advantages over traditional hard drives with moving parts with respect to, for example, performance, size, weight, ruggedness, operating temperature range, and power consumption. For example, SSDs can have reduced seek time, latency, or other delay associated with magnetic disk drives (e.g., electromechanical, etc.). SSDs use non-volatile memory cells, such as flash memory cells to obviate internal battery supply requirements, thus allowing the drive to be more versatile and compact. Managed NAND devices can be used as primary or ancillary memory in various forms of electronic devices, and are commonly used in mobile devices.

Both SSDs and managed memory devices can include a number of memory devices, including a number of dies or logical units (e.g., logical unit numbers or LUNs), and can include one or more processors or other controllers performing logic functions required to operate the memory devices or interface with external systems. Such SSDs and managed memory devices can include one or more flash memory die, including a number of memory arrays and peripheral circuitry thereon. The flash memory arrays can include a number of blocks of memory cells organized into a number of physical pages. In some examples, the SSDs can also include DRAM or SRAM (or other forms of memory die or other memory structures). Similarly, managed NAND devices can include one or more arrays of volatile and/or nonvolatile memory separate from the NAND storage array, and either within or separate from a controller. Both SSDs and managed NAND devices can receive commands from a host in association with memory operations, such as read or write operations to transfer data (e.g., user data and associated integrity data, such as error data and address data, etc.) between the memory devices and the host, or erase operations to erase data from the memory devices.

As referenced above, memory cells, such as NAND memory cells, which are used herein as an example configuration for demonstrating the present methods, may store multiple-bits per cell by representing each possible value combination of n bits as one of $2^n$ different voltage levels, where n is the number of bits that the cell stores. Thus, to store three-bits per cell (n=3), the memory cell may be programmed to one of eight different ($2^3$) voltage levels, each voltage level corresponds to one of each possible combination of bit states. Due to differences in manufacturing for each cell and certain operations of the memory, the voltage of each value combination may vary from cell to cell and each possible value combination may be represented by a voltage range.

Traditional two-dimensional (2D) NAND memory devices include a plurality of memory cells organized by rows and columns. Control gates of memory cells of a particular row are connected to a common word line. Source and drains of memory cells of a particular column are connected in series to a bit line. For each word line there are n pages that correspond to each bit that can be stored in the memory cells linked to the word line.

More recently, 3D NAND memory devices have become common. 3D NAND devices often include strings of storage cells, coupled in series (e.g., drain to source), between one or more source-side select gates (SGSs) proximate a source, and one or more drain-side select gates (SGDs) proximate a bit line. In an example, the SGSs or the SGDs can include one or more field-effect transistors (FETs) or metal-oxide semiconductor (MOS) structure devices, etc. In some examples, the strings will extend vertically, through multiple vertically spaced tiers containing respective word lines. A semiconductor structure may extend adjacent a string of storage cells to form a channel for the storage cells of the string. In the example of a vertical string, the polysilicon structure may be in the form of a vertically extending pillar. For 3D NAND memory devices including TLC memory cells, for such TLC memory cells each word line has a lower page (LP), an upper page (UP), and an extra page (XP) that each store one bit in each memory cell for all memory cells in the word line.

When programming data, to reduce the impact of cell-to-cell program interference that causes cells on adjacent word lines to experience an increase in threshold voltage, programming of each page is done at different times. For example, on a two-bit-per-cell NAND having lower and upper pages, the programming order may be: (1) lower page of word line 0 (WL0); (2) lower page of word line 1 (WL1); (3) upper page of word line 0 (WL0); (4) lower page of word line 2 (WL2); (5) upper page of word line 2 (WL2); and so on.

As such, for memory cells that store more than one-bit per cell, there is a delay between when programming starts and when programming finishes for each particular cell. If an asynchronous power loss (APL) occurs prior to completion of programming, some cells might be corrupted or have unexpected values. In certain examples, APL can refer to any unexpected or sudden loss of power, shutdown, or reset. Under normal circumstances, such as in response to a command to shut down (or enter sleep or hibernate modes) from a host device, etc., power is not removed from a storage system until the storage system acknowledges that unfinished write operations or saves are complete and addressing information is updated and stored. An APL may lead to data and addressing errors on the storage system. Back-to-back APL may be even more destructive. In certain examples, an APL can be detected, such as when resuming operation (e.g., normal operation) from a low-power state (e.g., an "off" state, reset, or other low-power state) without a prior or stored indication that such low-power state was entered in response to a shutdown command (e.g., including a reset command, a restart command, etc.).

When a request is received to write data, a physical address of where the data is to be written is determined. Typically, this will be within an open block—that is, a block that is actively being written to. Once an APL happens, the currently open block may have pages impacted by the APL due to incomplete programming of the pages. For example, a word line may have a lower page, but not an extra and/or upper page programmed.

One strategy to deal with an APL event during programming is to close the block and start a new one. In this scenario, back-to-back APL may generate many partial blocks (and therefore wasted space). This may prematurely exhaust free blocks, so a better strategy may be to continue to use the block that was open during the one or more APL.

An APL may occur during the beginning, middle, or end of the programming period. If the APL occurs during the beginning of the programming period, the system can determine that one or more of the last written pages are fake empty pages. In this case, the controller can pad dummy data to these one or more fake empty pages, such as to balance the values written to the cells of one or more pages, and continue to use the blocks starting from the next physical page.

If the APL occurs towards the end of the program period, the last written page data may be recoverable. In such case, the controller will not pad dummy data onto the last written page, but instead can relocate the data to the next truly empty page.

If the APL occurs in the middle of the program period, the data in the last written page may be unrecoverable. The system can use the fact that the page suffers from an unrepairable error correction code (UECC) condition to determine one or more of the last written pages are fake programmed pages. There are two options in this situation to deal with the last written page. A first option is to leave the page or pages as-is. In this scenario, the next lower page in the block will not have enough margin during the lower page recovery after an APL during programming of its extra page/upper page. If more than four word-lines are affected by back-to-back APL during early-middle programming, one normally programmed extra page of the next word line may become unrecoverable.

Another option is padding dummy data on the fake programmed page. If an APL happens during programming of the dummy data, the system may not recover the data of the last written page and may not determine that the one or more last written pages are fake programmed pages. Thus, the system may cause such pages to be padded with dummy data again. Back-to-back APLs may cause the one or more pages to be programmed with dummy data several times. This can cause other normally-programmed extra pages (XPs) in neighboring word lines (e.g., more than four word-lines) of a memory device that are fake programmed with several pad-dummy to become unrecoverable as well (e.g., writing dummy data to the XP may cause errors in one or more pages, such as the upper page (UP) or lower page (LP), etc.).

Host systems (e.g., hosts) typically include a host processor, a first amount of host memory (e.g., main memory, often volatile memory, such as DRAM) to support the host processor, and one or more storage systems (e.g., often non-volatile memory, such as flash memory) that provide additional storage to retain data in addition to or separate from the main memory.

A storage system (e.g., a solid-state drive (SSD), a universal flash storage (UFS) device, etc.) can include a memory controller and one or more memory devices, including a number of (e.g., multiple) dies or logical units (LUNs). In certain examples, each die can include a number of memory arrays and peripheral circuitry thereon, such as die logic or a die processor. The memory controller can include interface circuitry configured to communicate with a host device (e.g., the host processor or interface circuitry) through a communication interface (e.g., a bidirectional parallel or serial communication interface). The memory controller can receive commands or operations from the host system in association with memory operations or instructions, such as read or write operations to transfer data (e.g., user data and associated integrity data, such as error data or address data, etc.) between the memory devices and the host device, erase operations to erase data from the memory devices, perform drive management operations (e.g., data migration, garbage collection, block retirement), etc.

Software (e.g., programs), instructions, operating systems (OS), and other data are typically stored on storage systems and accessed by main memory for use by the host processor. Main memory (e.g., RAM) is typically faster, more expensive, and a different type of memory device (e.g., volatile) than a majority of the memory devices of the storage system (e.g., non-volatile, such as an SSD, etc.). In addition to the main memory, host systems can include different forms of volatile memory, such as a group of static memory (e.g., a cache, often SRAM), often faster than the main memory, in certain examples, configured to operate at speeds close to or exceeding the speed of the host processor, but with lower density and higher cost.

FIG. 1 illustrates an example system (e.g., a host system) 100 including a host device 105 and a storage system 110 (e.g., a UFS device) configured to communicate over a communication interface (I/F) 115 (e.g., a bidirectional parallel or serial communication interface, such as a UFS interface). In an example, the communication interface 115 can be referred to as a host interface. The host device 105 can include a host processor 106 (e.g., a host central processing unit (CPU) or other processor or processing circuitry, such as a memory management unit (MMU), interface circuitry, etc.). In certain examples, the host device 105 can include a main memory (MAIN MEM) 108 (e.g., DRAM, etc.) and optionally, a static memory (STATIC MEM) 109, to support operation of the host processor (HOST PROC) 106.

The storage system 110 can include a universal flash storage (UFS) device, an embedded MMC (eMMC™) device, or one or more other memory devices. For example, if the storage system 110 includes a UFS device, the communication interface 115 can include a serial bidirectional interface, such as defined in one or more JEDEC standards, including, for example upstream and downstream lanes (e.g., DIN_t, DIN_c and DOUT_t, DOUT_c, respectively). The UFS device can further include a unidirectional reset signal interface (RST), such as a hardware reset signal interface from the host device 105 to the storage system 110.

In another example, if the storage system 110 includes an eMMC device, the communication interface 115 can include a number of parallel bidirectional data lines (e.g., DAT[7:0]) and one or more command lines, such as defined in one or more JEDEC standards (e.g., JEDEC standard D84-B51 (JESD84-A51), commonly referred to as JEDEC eMMC standard 5.1, etc.). In other examples, the storage system 110 can include one or more other memory devices, or the communication interface 115 can include one or more other interfaces, depending on the host device 105 and the storage system 110.

The storage system 110 can include a memory controller (MEM CTRL) 111 and a non-volatile memory device 112. The memory controller 111 can optionally include a limited amount of static memory 119 to support operations of the memory controller 111. In an example, the non-volatile memory device 112 can include a number of non-volatile memory devices (e.g., dies or LUNs), such as one or more stacked flash memory devices (e.g., as illustrated with the stacked dashes underneath the non-volatile memory device 112), etc., each including non-volatile memory (NVM) 113 (e.g., one or more groups of non-volatile memory cells) and a device controller (CTRL) 114 or other periphery circuitry thereon (e.g., device logic, etc.), and controlled by the memory controller 111 over an internal storage-system communication interface (e.g., an Open NAND Flash Interface (ONFI) bus, etc.) separate from the communication interface 115. Control circuitry, as used herein, can refer to one or more of the memory controller 111, the device controller 114, or other periphery circuitry in the storage system 110, the NVM device 112, etc.

In three-dimensional (3D) architecture semiconductor memory device technology, vertical floating gate (FG) or replacement gate (RG) (or charge trapping) storage structures can be stacked, increasing the number of tiers, physical pages, and accordingly, the density of memory cells in a memory device. Data is often stored arbitrarily on the storage system as small units. Even if accessed as a single unit, data can be received in small, random 4-16k single file reads (e.g., 60%-80% of operations are smaller than 16k). It is difficult for a user and even kernel applications to indicate that data should be stored as one sequential cohesive unit. File systems are typically designed to optimize space usage, and not sequential retrieval space.

The memory controller 111 can receive instructions from the host device 105, and can communicate with the non-volatile memory device 112, such as to transfer data to (e.g., write or erase) or from (e.g., read) one or more of the memory cells of the non-volatile memory device 112. The memory controller 111 can include, among other things, circuitry or firmware, such as a number of components or integrated circuits. For example, the memory controller 111 can include one or more memory control units, circuits, or components configured to control access across the memory array and to provide a translation layer between the host device 105 and the storage system 100, such as a memory manager, one or more memory management tables, etc.

The memory manager can include, among other things, circuitry or firmware, such as a number of components or integrated circuits associated with various memory management functions, including, among other functions, wear leveling (e.g., garbage collection or reclamation), error detection or correction, block retirement, or one or more other memory management functions. The memory manager 125 can parse or format host commands (e.g., commands received from the host device 105) into device commands (e.g., commands associated with operation of a memory array, etc.), or generate device commands (e.g., to accomplish various memory management functions) for the device controller 114 or one or more other components of the storage system 110.

The memory manager can include a set of management tables configured to maintain various information associated with one or more component of the storage system 110 (e.g., various information associated with a memory array or one or more memory cells coupled to the memory controller 111). For example, the management tables can include information regarding block age, block erase count, error history, or one or more error counts (e.g., a write operation error count, a read bit error count, a read operation error count, an erase error count, etc.) for one or more blocks of memory cells coupled to the memory controller 111. In certain examples, if the number of detected errors for one or more of the error counts is above a threshold, the bit error can be referred to as an uncorrectable bit error. The management tables can maintain a count of correctable or uncorrectable bit errors, among other things. In an example, the management tables can include translation tables or a L2P mapping.

The memory manager can implement and use data structures to reduce storage system 110 latency in operations that involve searching L2P tables for valid pages, such as garbage collection. To this end, the memory manager is arranged to maintain a data structure (e.g., table region data structure, tracking data structure, etc.) for a physical block. The data structure includes indications of L2P mapping table regions, of the L2P table. In certain examples, the data structure is a bitmap (e.g., a binary array). In an example, the bitmap includes a bit for each region of multiple, mutually exclusive, regions that span the L2P table.

The non-volatile memory device 112 or the non-volatile memory 113 (e.g., one or more 3D NAND architecture semiconductor memory arrays) can include a number of memory cells arranged in, for example, a number of devices, planes, blocks, physical pages, super blocks, or super pages. As one example, a TLC memory device can include 18,592 bytes (B) of data per page, 1536 pages per block, 548 blocks per plane, and 4 planes per device. As another example, an MLC memory device can include 18,592 bytes (B) of data per page, 1024 pages per block, 548 blocks per plane, and 4 planes per device, but with half the required write time and twice the program/erase (P/E) cycles as a corresponding TLC memory device. Other examples can include other numbers or arrangements. A super block can include a combination of multiple blocks, such as from different planes, etc., and a window can refer to a stripe of a super block, typically matching a portion covered by a physical-to-logical (P2L) table chunk, etc., and a super page can include a combination of multiple pages.

The term "super" can refer to a combination or multiples of a thing or things. For examples, a super block can include a combination of blocks. If a memory device includes 4 planes, a super block may refer to the same block on each plane, or a pattern of blocks across the panes (e.g., a combination of block 0 on plane 0, block 1 on plane 1, block 2 on plane 2, and block 3 on plane 3, etc.). In an example, if a storage system includes multiple memory devices, the combination or pattern of blocks can extend across the multiple memory devices. The term "stripe" can refer to a pattern of combination or pattern of a piece or pieces of a thing or things. For example, a stripe of a super block can refer to a combination or pattern of pages from each block in the super block.

In operation, data is typically written to or read from the storage system 110 in pages and erased in blocks. However, one or more memory operations (e.g., read, write, erase, etc.) can be performed on larger or smaller groups of memory cells, as desired. For example, a partial update of tagged data from an offload unit can be collected during data migration or garbage collection to ensure it was re-written efficiently. The data transfer size of a memory device is typically referred to as a page, whereas the data transfer size of a host device is typically referred to as a sector. Although a page of data can include a number of bytes of user data (e.g., a data payload including a number of sectors of data) and its corresponding metadata, the size of the page often refers only to the number of bytes used to store the user data. As an example, a page of data having a page size of 4 kB may include 4 kB of user data (e.g., 8 sectors assuming a sector size of 512B) as well as a number of bytes (e.g., 32B, 54B, 224B, etc.) of auxiliary or metadata corresponding to the user data, such as integrity data (e.g., error detecting or correcting code data), address data (e.g., logical address data, etc.), or other metadata associated with the user data.

Different types of memory cells or memory arrays can provide for different page sizes, or may require different amounts of metadata associated therewith. For example, different memory device types may have different bit error rates, which can lead to different amounts of metadata necessary to ensure integrity of the page of data (e.g., a memory device with a higher bit error rate may require more bytes of error correction code (ECC) data than a memory device with a lower bit error rate). As an example, an MLC NAND flash device may have a higher bit error rate than a corresponding SLC NAND flash device. As such, the MLC device may require more metadata bytes for error data than the corresponding SLC device.

In an example, the data in a chunk or data unit can be handled in an optimized manner throughout its tenure on the storage system. For example, the data is managed as one unit during data migration (e.g., garbage collection, etc.) such that the efficient read/write properties are preserved as data is moved to its new physical location on the storage system. In certain examples, the only limit to the number of chunks, data units, or blocks configurable for storage, tagging, etc., are the capacities of the system.

One or more of the host device 105 or the storage system 110 can include interface circuitry, such as host interface circuitry (I/F CKT) 107 or storage interface circuitry (I/F CKT) 117, configured to enable communication between components of the host system 100. Each interface circuitry can include one or more UFS Interconnect (UIC) layers. In certain examples, the host I/F CKT 107 can include a controller (e.g., a UFS controller), a driver circuit (e.g., a UFS driver), etc.

Components of the host system 100 can be configured to receive or operate using one or more host voltages, including, for example, VCC, VCCQ, and, optionally, VCCQ2. VCC can be a first supply voltage (e.g., 2.7V-3.3V, 1.7V-1.95V, etc.). In an example, one or more of the static memory 119 or the non-volatile memory devices 112 can require VCC for operation. VCCQ can be a second supply voltage, lower than the VCC (e.g., 1.1V-1.3V, etc.). In an example, one or more of the memory controller 111, the communication interface 115, or memory I/O or other low voltage blocks can optionally require VCCQ for operation. VCCQ2 can be a third supply voltage between VCC and VCCQ (e.g., 1.7V-1.95V, etc.). In an example, one or more of the memory controller 111 of the communication interface, or other low voltage block can optionally require VCCQ2. In certain examples, in deep sleep mode, VCC (and optionally VCCQ2) can be removed, leaving VCCQ enabled.

Figure 2:
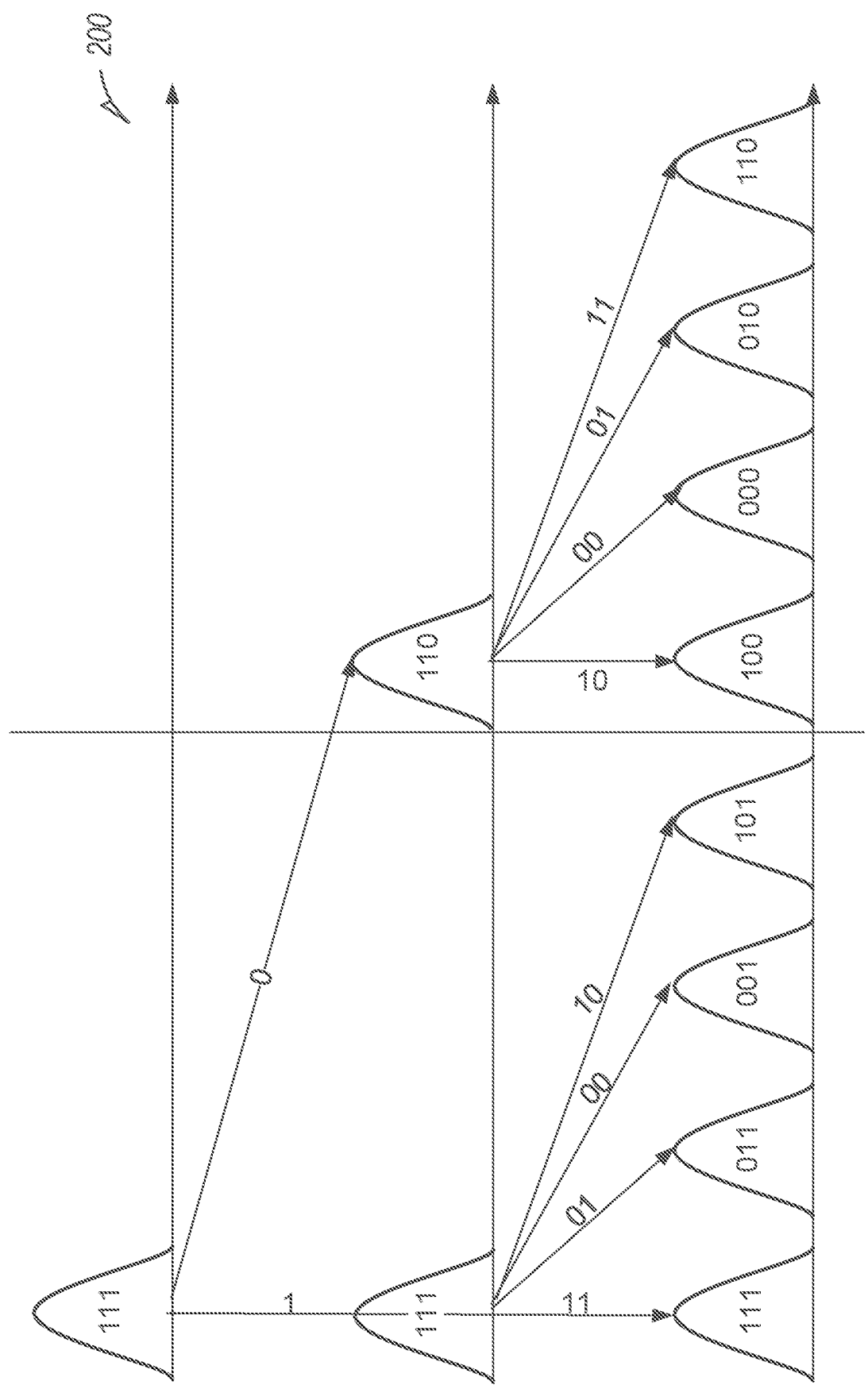
FIG. 2 illustrates programming of triple level cell memory cells according to some examples of the present disclosure.

FIG. 2 shows state transitions of a TLC memory cell of a 3D TLC NAND memory device, such as described above with respect to FIG. 1, according to some examples of the present disclosure. The state of a memory cell starts at 111 (unprogrammed) where the lower page (LP) is the least significant bit in the diagram (e.g., the third "1" in "111"). The first programming operation programs the LP to either a 1 or a 0. The next programming operations program the extra page (XP) and the upper page (UP) (e.g., the first and second "1s" in "111", respectively). The curves in FIG. 2 show an expected distribution of voltage in the cell for the labeled state where higher voltages are to the right. Thus, 111 is a lower voltage distribution than 110, which is the highest voltage distribution. The order of distributions in FIG. 2, from lowest to highest, is as follows: 111, 011, 001, 101, 100, 000, 010, and 110.

When the LP of the memory cell is programmed, all cells in the page will have one of two states: 1 or 0. The initial state of any cell is 1. To change the cell to a 0 a programming pulse is applied to the cell. For a 16k page, there can be 148,736 cells. During programming, the system can try to balance the number of 0s and 1s, such that the number of 0s and 1s in a reliably programmed page are nearly the same (e.g., within a threshold number or percentage of cells, such as 20%, 10%, 5%, etc.). Programmed pages that fall within that threshold are termed "well-distributed". Thus, in a reliably programmed, well-distributed 16k page, about half of the cells, (e.g., 74,368 cells) will transition from state the initial state, 1, to 0.

The XP and UP will have a total of two bits which allows for four possible states: 11, 01, 00, and 10. For the XP and UP program, it can be assumed that almost half of the state transitions will start from LP state 1 and another half will start from LP state 0. Eventually all cells will have eight possible states and the system can attempt to distribute all cells to make all eight states well-distributed.

From state 1 of the LP, the XP and UP may transition from 11, to 01, 00, and 10—depending on the value of the XP and UP. From state 0 of the LP, the memory cell starts at 100-which means the XP is 1. Those bits will not be moved before finishing the transition from state 1 of the LP—thus, the XP bits will stay at 1. From state 1 of the LP, ¾*½*148736=55776 cells may leave the state 111 to move to one of states 011, 001, and 101. There will be almost 55776 extra page bits which are 0 during the programming period.

After almost finishing the program from state 1 of LP, NAND will program for state 0 of the LP. The XP/UP will go from 10 to 00, to 01 and end at 11 based upon the value of the extra page and upper page. Eventually the extra page will have almost half (74368) of the bits set to zero. In physical pages having a different number of memory cells, the thresholds will move relative to the number of memory cells in the physical page, however the relationships described above should remain.

In some examples, after an APL, the NAND controller can use the number of zeros to determine if the dummy pad data will need to be programmed into the fake programmed page, such as to avoid double writing dummy data into a fake programmed page (e.g., after back-to-back APL). The system can get the number of zeros directly after a page read. If the number of zeros is less than a first threshold (e.g., 67266, a golden section between 55776 and 74368, etc.), then the system can program pad-dummy data in the page, otherwise the system can refrain from programming further dummy data. By utilizing the number of zeros to quickly determine if pad-dummy data is needed, the system can avoid double-writing of pad-dummy data and consequential loss of other cells. In other examples, other numbers of zeros can be used as a threshold, depending on the size of the physical page and the number of pages associated with each cell (e.g., the threshold can be different for different size pages and different level of programming, such as MLC, QLC, etc.). Although described herein with respect to zeros, it is understood that the number of ones, in addition to or instead of the number of zeros, may also be used in accordance herewith.

Figure 3:
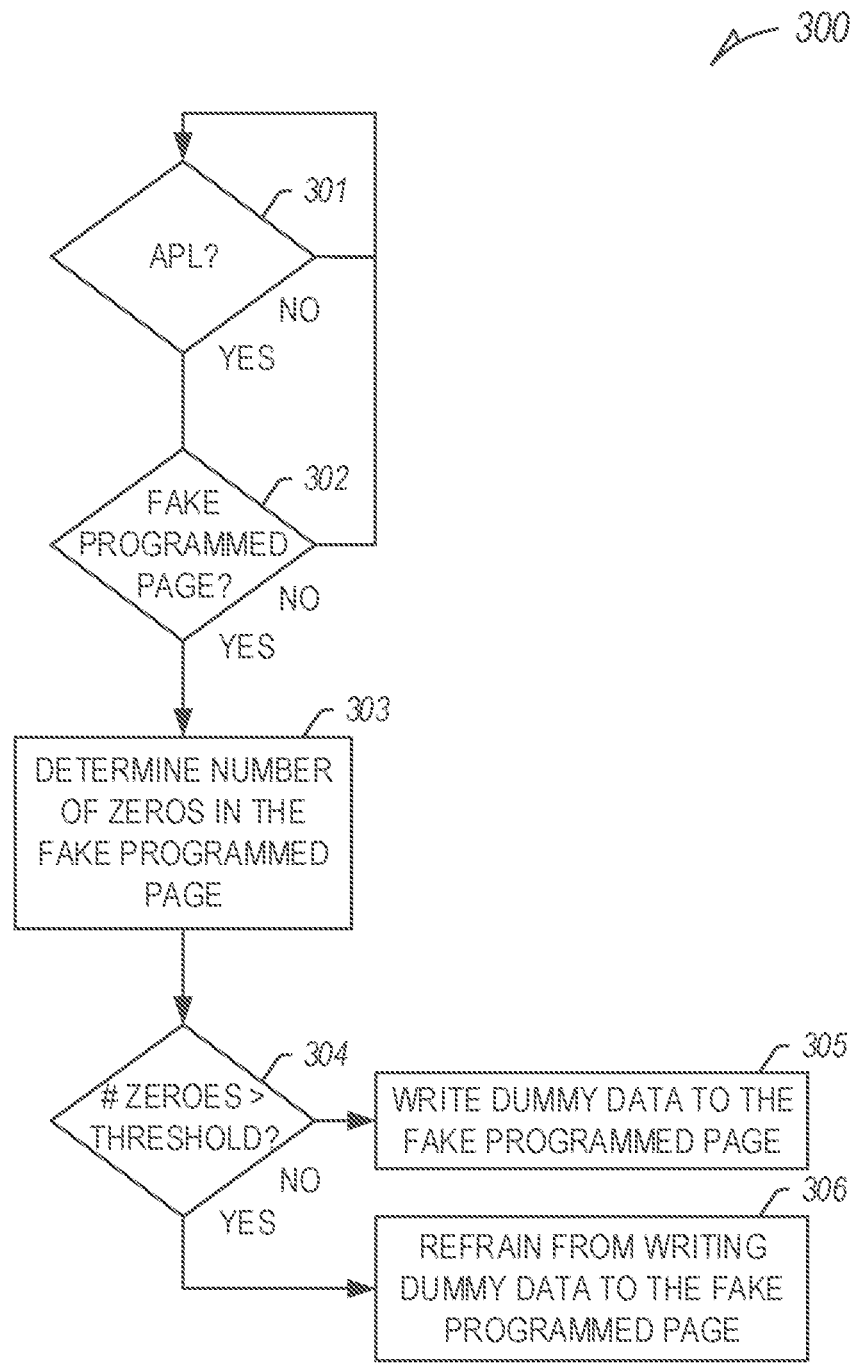
FIG. 3 illustrates a flowchart of a method of a controller of a NAND device determining whether to write dummy values to a page according to some examples of the present disclosure.

FIG. 3 illustrates a flowchart of a method 300 of control circuitry of a storage system determining whether to write dummy values to a first physical page according to some examples of the present disclosure. The method of FIG. 3 can be performed, for example, by the storage system 110, such as described in FIG. 1, by the memory device 500, such as described in FIG. 5, by the machine 600 described in FIG. 6, or one or more other control circuitry or storage system described herein.

At operation 301 the NAND device may determine that a last shutdown was an asynchronous power loss (APL). For example, a bit may be set in NAND or other non-volatile memory that is cleared upon a synchronous power loss. Upon bootup the bit is checked to determine if the last shutdown was synchronous. If the bit is set, then the last shutdown can be assumed to have been one or more APL. At operation 302, responsive to determining that an APL occurred, the system can optionally determine if one or more of the last programmed pages is a fake programmed page. If one or more of the last programmed pages are determined to be fake programmed pages, at operation 303, the system can read the memory cells to determine the number of zeros stored in the last written page (e.g., optionally in one or more determined fake programmed pages, etc.). At operation 304 the system can compare the determined number of zeros to a threshold. In some examples, the threshold may be based upon the number of cells in a page and the number of levels in a cell, such as described above.

At operation 305, if the number of zeros is not greater than the threshold, then the system can write dummy date to the page (e.g., until the number of zeros in the page meet or exceed the threshold). At operation 306, if the number of zeros is greater than the threshold, then the system can refrain from writing dummy data to the page.

As noted earlier, NAND devices, such as those described herein that utilize a count of the number of zeros in a page to determine whether to write dummy data after APL, may be used in a variety of electronic devices. Electronic devices, such as mobile electronic devices (e.g., smart phones, tablets, etc.), electronic devices for use in automotive applications (e.g., automotive sensors, control units, driver-assistance systems, passenger safety or comfort systems, etc.), and internet-connected appliances or devices (e.g., internet-of-things (IoT) devices, etc.), have varying storage needs depending on, among other things, the type of electronic device, use environment, performance expectations, etc.

Figure 4:
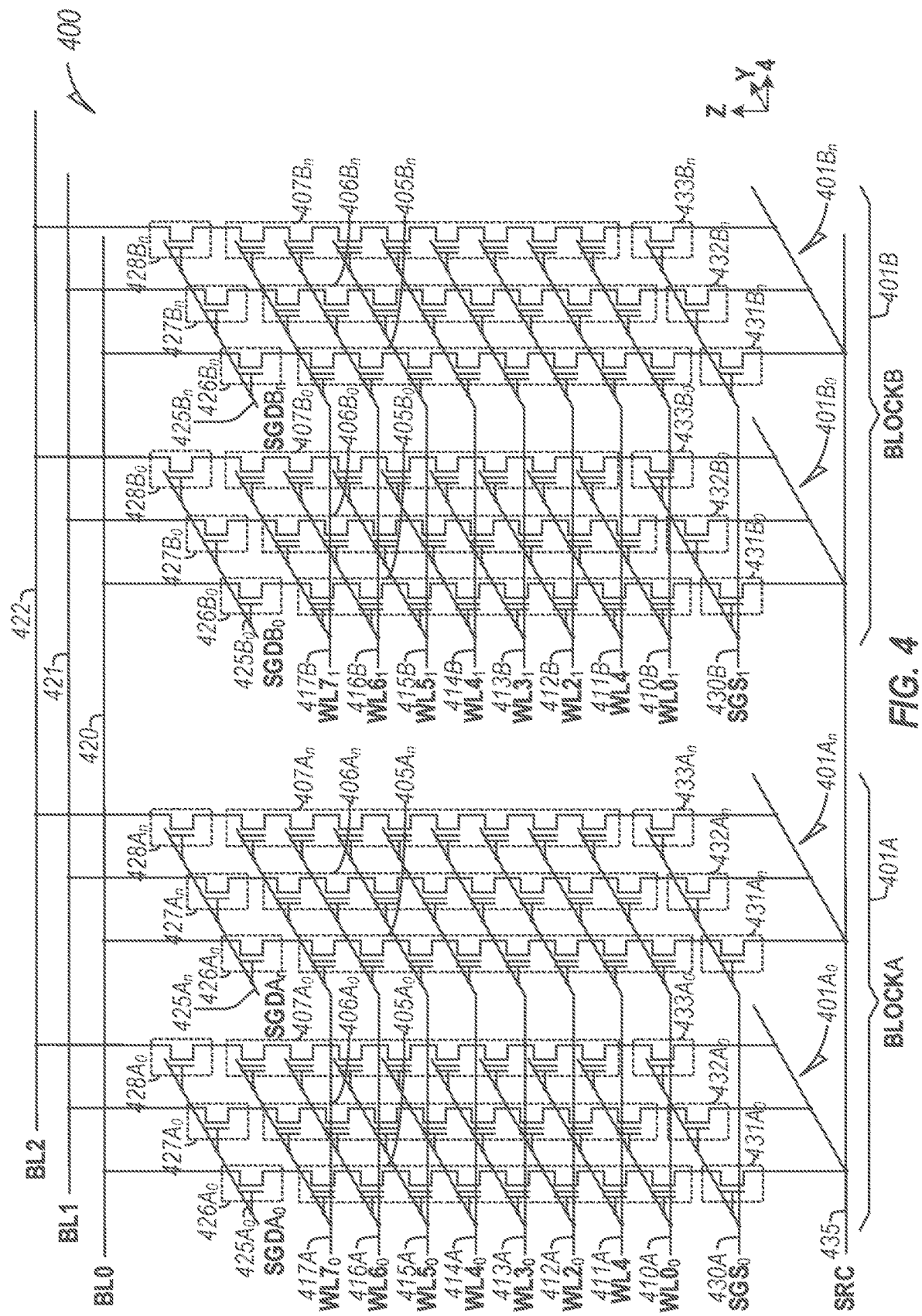
FIG. 4 illustrates an example schematic diagram of a NAND architecture semiconductor memory array.

FIG. 4 illustrates an example schematic diagram of a 3D NAND architecture semiconductor memory array 400, such as illustrated in FIG. 1 and described above with respect to FIGS. 2 and 3, the memory array 400 including a number of strings of memory cells (e.g., first-third $A_0$ memory strings $405A_0$-$407A_0$, first-third $A_n$ memory strings $405A_n$-$407A_n$, first-third $B_0$ memory strings $405B_0$-$407B_0$, first-third $B_n$ memory strings $405B_n$-$407B_n$, etc.), organized in blocks (e.g., block A 401A, block B 401B, etc.) and sub-blocks (e.g., sub-block $A_0$ $401A_0$, sub-block $A_n$ $401A_n$, sub-block $B_0$ $401B_0$, sub-block $B_n$ $401B_n$, etc.). The memory array 400 represents a portion of a greater number of similar structures that would typically be found in a block, device, or other unit of a memory device.

Each string of memory cells includes a number of tiers of storage transistors (e.g., floating gate, replacement gate, charge trapping structures, etc.) stacked in the Z direction, source to drain, between a source line (SRC) 435 or a source-side select gate (SGS) (e.g., first-third $A_0$ SGS $431A_0$-$433A_0$, first-third $A_n$ SGS $431A_n$-$433A_n$, first-third $B_0$ SGS $431B_0$-$433B_0$, first-third $B_n$ SGS $431B_n$-$433B_n$, etc.) and a drain-side select gate (SGD) (e.g., first-third $A_0$ SGD $426A_0$-$428A_0$, first-third $A_n$ SGD $426A_n$-$428A_n$, first-third $B_0$ SGD $426B_0$-$428B_0$, first-third $B_n$ SGD $426B_n$-$428B_n$, etc.). Each string of memory cells in the 3D memory array can be arranged along the X direction as data lines (e.g., bit lines (BL) BL0-BL3 420-422), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, each block having two sub-blocks, each sub-block having a single physical page, each physical page having three strings of memory cells, and each string having 8 tiers of memory cells, in other examples, the memory array 400 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 400 includes a control gate (CG) coupled to (e.g., electrically or otherwise operatively connected to) an access line (e.g., word lines (WL) $WL0_0$-$WL7_0$ 410A-417A, $WL0_1$-$WL7_1$ 410B-417B, etc.), which collectively couples the control gates (CGs) across a specific tier, or a portion of a tier, as desired. Specific tiers in the 3D memory array, and accordingly, specific memory cells in a string, can be accessed or controlled using respective access lines. Groups of select gates can be accessed using various select lines. For example, first-third $A_0$ SGD $426A_0$-$428A_0$ can be accessed using an $A_0$ SGD line $SGDA_0$ $425A_0$, first-third $A_n$ SGD $426A_n$-$428A_n$ can be accessed using an $A_n$ SGD line $SGDA_n$ $425A_n$, first-third $B_0$ SGD $426B_0$-$428B_0$ can be accessed using a $B_0$ SGD line $SGDB_0$ $425B_0$, and first-third $B_n$ SGD $426B_n$-$428B_n$ can be accessed using a $B_n$ SGD line $SGDB_n$ $425B_n$. First-third $A_0$ SGS $431A_0$-$433A_0$ and first-third $A_n$ SGS $431A_n$-$433A_n$ can be accessed using a gate select line $SGS_0$ $430A_n$ and first-third $B_0$ SGS $431B_0$-$433B_0$ and first-third $B_n$ SGS $431B_n$-$433B_n$ can be accessed using a gate select line $SGS_1$ 430B.

In an example, the memory array 400 can include a number of levels of semiconductor material (e.g., polysilicon, etc.) configured to couple the control gates (CGs) of each memory cell or select gate (or a portion of the CGs or select gates) of a respective tier of the array. Specific strings of memory cells in the array can be accessed, selected, or controlled using a combination of bit lines (BLs) and select gates, etc., and specific memory cells at one or more tiers in the specific strings can be accessed, selected, or controlled using one or more access lines (e.g., word lines).

In a NAND architecture semiconductor memory array, the state of a selected memory cell can be accessed by sensing a current or voltage variation associated with a particular data line containing the selected memory cell. The memory array 400 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., bit lines BL0-BL2), access lines (e.g., word lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected word lines (e.g., $WL4_0$), and thus, to a control gate of each memory cell coupled to the selected word lines. Programming pulses can begin, for example, at or near 15V, and, in certain examples, can increase in magnitude during each programming pulse application. While the program voltage is applied to the selected word lines, a potential, such as a ground potential (e.g., Vss), can be applied to the data lines (e.g., bit lines) and substrates (and thus the channels, between the sources and drains) of the memory cells targeted for programming, resulting in a charge transfer (e.g., direct injection or Fowler- Nordheim (FN) tunneling, etc.) from the channels to the floating gates of the targeted memory cells.

In contrast, a pass voltage (Vpass) can be applied to one or more word lines having memory cells that are not targeted for programming, or an inhibit voltage (e.g., Vcc) can be applied to data lines (e.g., bit lines) having memory cells that are not targeted for programming, for example, to inhibit charge from being transferred from the channels to the floating gates of such non-targeted memory cells. The pass voltage can be variable, depending, for example, on the proximity of the applied pass voltages to a word line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific word line, such as $WL4_0$, a pass voltage of 10 can be applied to one or more other word lines, such as $WL3_0$, $WL5_0$, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to $WL4_0$, a pass voltage of 10V can be applied to $WL3_0$ and $WL5_0$, a pass voltage of 8V can be applied to $WL2_0$ and $WL6_0$, a pass voltage of 7V can be applied to $WL1_0$ and $WL7_0$, etc. In other examples, the pass voltages, or number of word lines, etc., can be higher or lower, or more or less.

Sense amplifiers can be coupled to one or more of the data lines (e.g., first, second, or third bit lines (BL0-BL2) 420-422), can detect the state of each memory cell in respective data lines by sensing a voltage or current on a particular data line.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more bit lines, select gates, etc.), while the word lines of the targeted memory cells are kept at a potential, such as a ground potential (e.g., Vss), resulting in a charge transfer (e.g., direct injection or Fowler-Nordheim (FN) tunneling, etc.) from the floating gates of the targeted memory cells to the channels.

Figure 5:
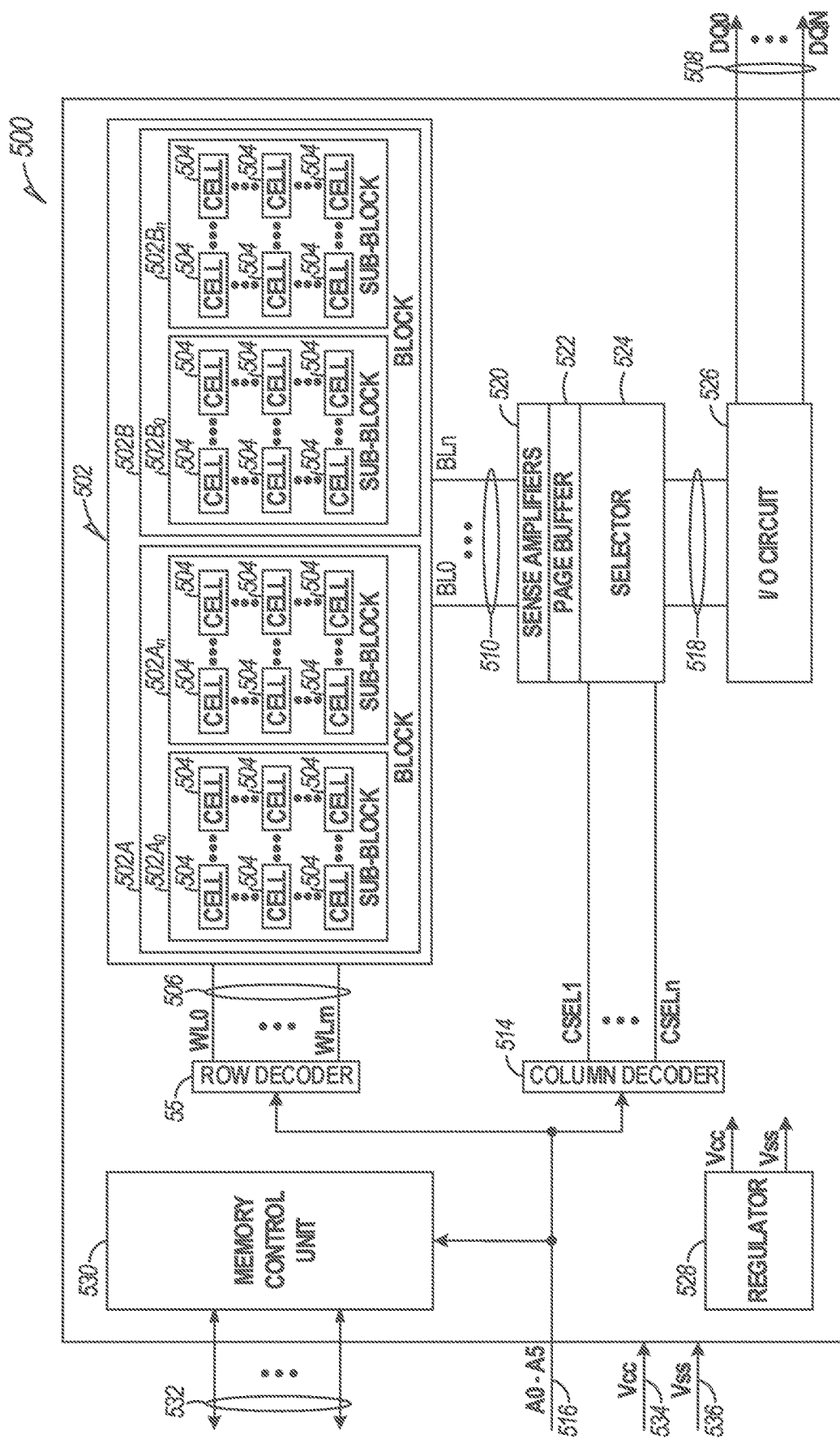
FIG. 5 illustrates an example block diagram of a memory device.

FIG. 5 illustrates an example block diagram of a memory device 500, such as described above with respect to FIGS. 1 and 4, including a memory array 502 having a plurality of memory cells 504, and one or more circuits or components to provide communication with, or perform one or more memory operations on, the memory array 502. Although shown with a single memory array 502, in other examples, one or more additional memory arrays, dies, or LUNs can be included herein. In certain examples, in a storage system having a number of dies or LUNs, the memory device 500 can represent a block diagram of circuits and components for each die or LUN. The memory device 500 can include a row decoder 512, a column decoder 514, sense amplifiers 520, a page buffer 522, a selector 524, an input/output (I/O) circuit 526, and a memory control unit 530.

The memory cells 504 of the memory array 502 can be arranged in blocks, such as first and second blocks 502A, 502B. Each block can include sub-blocks. For example, the first block 502A can include first and second sub-blocks $502A_0$, $502A_n$, and the second block 502B can include first and second sub-blocks $502B_0$, $502B_n$. Each sub-block can include a number of physical pages, each page including a number of memory cells 504. Although illustrated herein as having two blocks, each block having two sub-blocks, and each sub-block having a number of memory cells 504, in other examples, the memory array 502 can include more or fewer blocks, sub-blocks, memory cells, etc. In other examples, the memory cells 504 can be arranged in a number of rows, columns, pages, sub-blocks, blocks, etc., and accessed using, for example, access lines 506, first data lines 510, or one or more select gates, source lines, etc.

The memory control unit 530 can control memory operations of the memory device 500 according to one or more signals or instructions received on control lines 532, including, for example, one or more clock signals or control signals that indicate a desired operation (e.g., write, read, erase, etc.), or address signals (A0-AX) received on one or more address lines 516. One or more devices external to the memory device 500 can control the values of the control signals on the control lines 532, or the address signals on the address line 516. Examples of devices external to the memory device 500 can include, but are not limited to, a host, a memory controller, a processor, or one or more circuits or components not illustrated in FIG. 5.

The memory device 500 can use access lines 506 and first data lines 510 to transfer data to (e.g., write or erase) or from (e.g., read) one or more of the memory cells 504. The row decoder 512 and the column decoder 514 can receive and decode the address signals (A0-AX) from the address line 516, can determine which of the memory cells 504 are to be accessed, and can provide signals to one or more of the access lines 506 (e.g., one or more of a plurality of word lines (WL0-WLm)) or the first data lines 510 (e.g., one or more of a plurality of bit lines (BL0-BLn)), such as described above.

The memory device 500 can include sense circuitry, such as the sense amplifiers 520, configured to determine the values of data on (e.g., read), or to determine the values of data to be written to, the memory cells 504 using the first data lines 510. For example, in a selected string of memory cells 504, one or more of the sense amplifiers 520 can read a logic level in the selected memory cell 504 in response to a read current flowing in the memory array 502 through the selected string to the data lines 510.

One or more devices external to the memory device 500 can communicate with the memory device 500 using the I/O lines (DQ0-DQN) 508, address lines 516 (A0-AX), or control lines 532. The input/output (I/O) circuit 526 can transfer values of data in or out of the memory device 500, such as in or out of the page buffer 522 or the memory array 502, using the I/O lines 508, according to, for example, the control lines 532 and address lines 516. The page buffer 522 can store data received from the one or more devices external to the memory device 500 before the data is programmed into relevant portions of the memory array 502, or can store data read from the memory array 502 before the data is transmitted to the one or more devices external to the memory device 500.

The column decoder 514 can receive and decode address signals (A0-AX) into one or more column select signals (CSEL1-CSELn). The selector 524 (e.g., a select circuit) can receive the column select signals (CSEL1-CSELn) and select data in the page buffer 522 representing values of data to be read from or to be programmed into memory cells 504. Selected data can be transferred between the page buffer 522 and the I/O circuit 526 using second data lines 518.

The memory control unit 530 can receive positive and negative supply signals, such as a supply voltage (Vcc) 534 and a negative supply (Vss) 536 (e.g., a ground potential), from an external source or supply (e.g., an internal or external battery, an AC-to-DC converter, etc.). In certain examples, the memory control unit 530 can include a regulator 528 to internally provide positive or negative supply signals.

Figure 6:
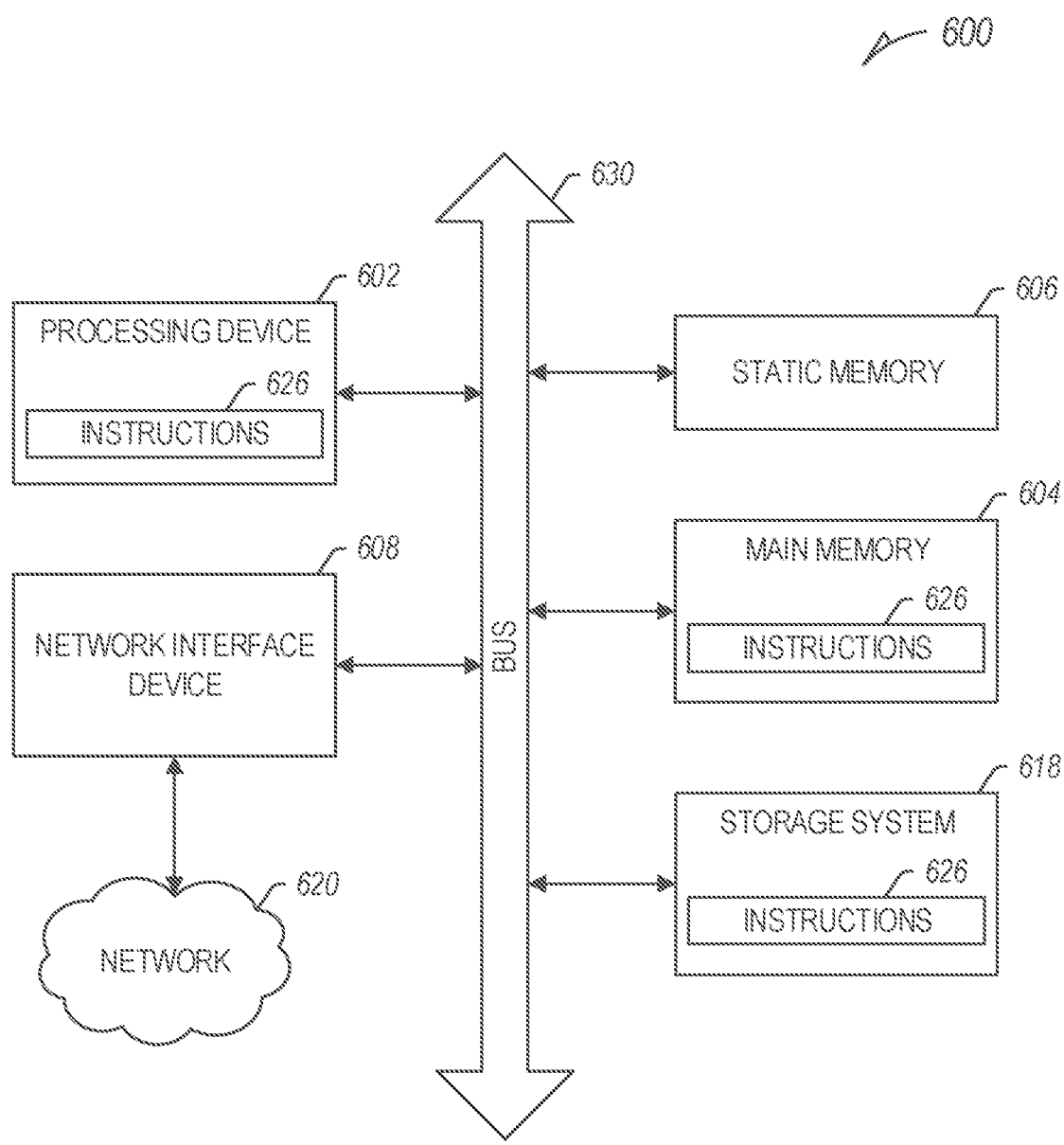
FIG. 6 illustrates an example block diagram of an information handling system.

FIG. 6 illustrates a block diagram of an example machine 600 of an example system which may incorporate a memory device (or larger memory system) such as, for example those described in with respect to the system of FIG. 1, the array of FIG. 4, or the memory device of FIG. 5) configured to implement any one or more of the techniques (e.g., methodologies) discussed herein such as, for example, the methods discussed in reference to FIG. 3 in alternative embodiments, the machine 600 may operate as a standalone device or may be connected (e.g., networked) to other machines. In a networked deployment, the machine 600 may operate in the capacity of a server machine, a client machine, or both in server-client network environments. In an example, the machine 600 may act as a peer machine in peer-to-peer (P2P) (or other distributed) network environment. The machine 600 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic, components, devices, packages, or mechanisms. Circuitry is a collection (e.g., set) of circuits implemented in tangible entities that include hardware (e.g., simple circuits, gates, logic, etc.). Circuitry membership may be flexible overtime and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry at a different time.

The machine (e.g., computer system, a host system, etc.) 600 may include a processing device 602 (e.g., a hardware processor, a central processing unit (CPU), a graphics processing unit (GPU), a hardware processor core, or any combination thereof, etc.), a main memory 604 (e.g., read-only memory (ROM), dynamic random-access memory (DRAM) such as synchronous DRAM (SDRAM) or Rambus DRAM (RDRAM), etc.), a static memory 606 (e.g., static random-access memory (SRAM), etc.), and a storage system 618, some or all of which may communicate with each other via a communication interface (e.g., a bus) 630.

The processing device 602 can represent one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. The processing device 602 can also be one or more special-purpose processing devices such as an application specific integrated circuit (ASIC), a field programmable gate array (FPGA), a digital signal processor (DSP), network processor, or the like. The processing device 602 can be configured to execute instructions 626 for performing the operations and steps discussed herein. The computer system 600 can further include a network interface device 608 to communicate over a network 620.

The storage system 618 can include a machine-readable storage medium (also known as a computer-readable medium) on which is stored one or more sets of instructions 626 or software embodying any one or more of the methodologies or functions described herein. The instructions 626 can also reside, completely or at least partially, within the main memory 604 or within the processing device 602 during execution thereof by the computer system 600, the main memory 604 and the processing device 602 also constituting machine-readable storage media.

The term "machine-readable storage medium" should be taken to include a single medium or multiple media that store the one or more sets of instructions, or any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The machine 600 may further include a display unit, an alphanumeric input device (e.g., a keyboard), and a user interface (UI) navigation device (e.g., a mouse). In an example, one or more of the display unit, the input device, or the UI navigation device may be a touch screen display. The machine a signal generation device (e.g., a speaker), or one or more sensors, such as a global positioning system (GPS) sensor, compass, accelerometer, or one or more other sensor. The machine 600 may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The instructions 626 (e.g., software, programs, an operating system (OS), etc.) or other data are stored on the storage system 618 can be accessed by the main memory 604 for use by the processing device 602. The main memory 604 (e.g., DRAM) is typically fast, but volatile, and thus a different type of storage than the storage system 618 (e.g., an SSD), which is suitable for long-term storage, including while in an "off" condition. The instructions 626 or data in use by a user or the machine 600 are typically loaded in the main memory 604 for use by the processing device 602. When the main memory 604 is full, virtual space from the storage system 618 can be allocated to supplement the main memory 604; however, because the storage system 618 device is typically slower than the main memory 604, and write speeds are typically at least twice as slow as read speeds, use of virtual memory can greatly reduce user experience due to storage system latency (in contrast to the main memory 604, e.g., DRAM). Further, use of the storage system 618 for virtual memory can greatly reduce the usable lifespan of the storage system 618.

The instructions 624 may further be transmitted or received over a network 620 using a transmission medium via the network interface device 608 utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi, IEEE 802.16 family of standards known as WiMax®), IEEE 802.15.4 family of standards, peer-to-peer (P2P) networks, among others. In an example, the network interface device 608 may include one or more physical jacks (e.g., Ethernet, coaxial, or phone jacks) or one or more antennas to connect to the network 620. In an example, the network interface device 608 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 600, and includes digital or analog communications signals or other intangible medium to facilitate communication of such software.

The above detailed description includes references to the accompanying drawings, which form a part of the detailed description. The drawings show, by way of illustration, specific embodiments in which the invention can be practiced. These embodiments are also referred to herein as "examples". Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein". Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

In various examples, the components, controllers, processors, units, engines, or tables described herein can include, among other things, physical circuitry or firmware stored on a physical device. As used herein, "processor" means any type of computational circuit such as, but not limited to, a microprocessor, a microcontroller, a graphics processor, a digital signal processor (DSP), or any other type of processor or processing circuit, including a group of processors or multi-core devices.

The term "horizontal" as used in this document is defined as a plane parallel to the conventional plane or surface of a substrate, such as that underlying a wafer or die, regardless of the actual orientation of the substrate at any point in time. The term "vertical" refers to a direction perpendicular to the horizontal as defined above. Prepositions, such as "on," "over," and "under" are defined with respect to the conventional plane or surface being on the top or exposed surface of the substrate, regardless of the orientation of the substrate; and while "on" is intended to suggest a direct contact of one structure relative to another structure which it lies "on" (in the absence of an express indication to the contrary); the terms "over" and "under" are expressly intended to identify a relative placement of structures (or layers, features, etc.), which expressly includes—but is not limited to—direct contact between the identified structures unless specifically identified as such. Similarly, the terms "over" and "under"

are not limited to horizontal orientations, as a structure may be "over" a referenced structure if it is, at some point in time, an outermost portion of the construction under discussion, even if such structure extends vertically relative to the referenced structure, rather than in a horizontal orientation.

The terms "wafer" and "substrate" are used herein to refer generally to any structure on which integrated circuits are formed, and also to such structures during various stages of integrated circuit fabrication. The following detailed description is, therefore, not to be taken in a limiting sense, and the scope of the various embodiments is defined only by the appended claims, along with the full scope of equivalents to which such claims are entitled.

Various embodiments according to the present disclosure and described herein include memory utilizing a vertical structure of memory cells (e.g., NAND strings of memory cells). As used herein, directional adjectives will be taken relative a surface of a substrate upon which the memory cells are formed (i.e., a vertical structure will be taken as extending away from the substrate surface, a bottom end of the vertical structure will be taken as the end nearest the substrate surface and a top end of the vertical structure will be taken as the end farthest from the substrate surface).

As used herein, directional adjectives, such as horizontal, vertical, normal, parallel, perpendicular, etc., can refer to relative orientations, and are not intended to require strict adherence to specific geometric properties, unless otherwise noted. For example, as used herein, a vertical structure need not be strictly perpendicular to a surface of a substrate, but may instead be generally perpendicular to the surface of the substrate, and may form an acute angle with the surface of the substrate (e.g., between 60 and 120 degrees, etc.).

In some embodiments described herein, different doping configurations may be applied to a select gate source (SGS), a control gate (CG), and a select gate drain (SGD), each of which, in this example, may be formed of or at least include polysilicon, with the result such that these tiers (e.g., polysilicon, etc.) may have different etch rates when exposed to an etching solution. For example, in a process of forming a monolithic pillar in a 3D semiconductor device, the SGS and the CG may form recesses, while the SGD may remain less recessed or even not recessed. These doping configurations may thus enable selective etching into the distinct tiers (e.g., SGS, CG, and SGD) in the 3D semiconductor device by using an etching solution (e.g., tetramethylammonium hydroxide (TMCH)).

Operating a memory cell, as used herein, includes reading from, writing to, or erasing the memory cell. The operation of placing a memory cell in an intended state is referred to herein as "programming," and can include both writing to or erasing from the memory cell (i.e., the memory cell may be programmed to an erased state).

According to one or more embodiments of the present disclosure, a memory controller (e.g., a processor, controller, firmware, etc.) located internal or external to a memory device, is capable of determining (e.g., selecting, setting, adjusting, computing, changing, clearing, communicating, adapting, deriving, defining, utilizing, modifying, applying, etc.) a quantity of wear cycles, or a wear state (e.g., recording wear cycles, counting operations of the memory device as they occur, tracking the operations of the memory device it initiates, evaluating the memory device characteristics corresponding to a wear state, etc.)

According to one or more embodiments of the present disclosure, a memory access device may be configured to provide wear cycle information to the memory device with each memory operation. The memory device control circuitry (e.g., control logic) may be programmed to compensate for memory device performance changes corresponding to the wear cycle information. The memory device may receive the wear cycle information and determine one or more operating parameters (e.g., a value, characteristic) in response to the wear cycle information.

It will be understood that when an element is referred to as being "on," "connected to" or "coupled with" another element, it can be directly on, connected, or coupled with the other element or intervening elements may be present. In contrast, when an element is referred to as being "directly on," "directly connected to" or "directly coupled with" another element, there are no intervening elements or layers present. If two elements are shown in the drawings with a line connecting them, the two elements can be either be coupled, or directly coupled, unless otherwise indicated.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, the code can be tangibly stored on one or more volatile or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

Example 1 is a storage system comprising: at least one non-volatile memory device comprising multiple memory cells organized in physical pages; and control circuitry coupled to the at least one non-volatile memory device, the control circuitry configured to: in response to a detected asynchronous power loss (APL) at the storage system, determine a number of zeros stored in a first physical page of memory cells; and determine whether to write dummy data to the first physical page using the determined number of zeros in the first physical page.

In Example 2, the subject matter of Example 1, wherein, in response to the detected APL, the control circuitry is configured to detect one or more fake programmed pages, wherein the first physical page is a detected fake programmed page.

In Example 3, the subject matter of any of Examples 1-2, wherein the control circuitry is configured to detect, upon resuming operation from a low-power state, if such low-power state was an APL.

In Example 4, the subject matter of any of Examples 1-3, wherein each memory cell of the first physical page of memory cells comprises a lower page (LP), an upper page (UP), and an extra page (XP), wherein, to determine the number of zeros stored in the first physical page of memory cells, the control circuitry is configured to determine the number of zeroes stored in the XPs of the memory cells of the first physical page of memory cells, and wherein, to determine whether to write dummy data to the first physical page, the control circuitry is configured to determine whether to write dummy data to the XPs of memory cells of the first physical page of memory cells.

In Example 5, the subject matter of Example 4, wherein, to determine the number of zeros stored in the XPs of the memory cells of the first physical page of memory cells, the control circuitry is configured to read the values stored in the XPs of the first physical page of memory cells.

In Example 6, the subject matter of any of Examples 1-5, wherein, to determine whether to write dummy data to the first physical page, the control circuitry is configured to compare the determined number of zeros to a threshold, and wherein the control circuit is configured to write dummy data to the first physical page of memory cells if the number of zeros exceeds the threshold.

In Example 7, the subject matter of Example 6, wherein the threshold is a function of the number of memory cells in the first physical page and the number of bits in the multiple memory cells.

In Example 8, the subject matter of any of Examples 1-7, wherein, to determine whether to write dummy data to the first physical page, the control circuitry is configured to compare the determined number of zeros to a threshold, and wherein the control circuit is configured to refrain from writing dummy data to the first physical page of memory cells if the number of zeros does not exceed the threshold.

Example 9 is a method implemented by control circuitry of a storage system comprising at least one non-volatile memory device comprising multiple memory cells organized in physical pages, the method comprising: detecting an asynchronous power loss (APL) at the storage system; in response to the detected APL, determining a number of zeros stored in a first physical page of memory cells of the storage system; and determining whether to write dummy data to the first physical page using the determined number of zeros in the first physical page.

In Example 10, the subject matter of Example 9, comprising: in response to the detected APL, detecting one or more fake programmed pages, wherein determining the number of zeros stored in the first physical page comprises in response to the detected one or more fake programmed pages, wherein the first physical page of memory cells is one of the one or more detected fake programmed pages.

In Example 11, the subject matter of any of Examples 9-10, wherein detecting the APL comprises, upon resuming operation from a low-power state, detecting if such low-power state was an APL.

In Example 12, the subject matter of any of Examples 9-11, wherein each memory cell of the first physical page of memory cells comprises a lower page (LP), an upper page (UP), and an extra page (XP), wherein determining the number of zeros stored in the first physical page of memory cells comprises determining the number of zeroes stored in the XPs of the memory cells of the first physical page of memory cells, and wherein determining whether to write dummy data to the first physical page comprises determining whether to write dummy data to the XPs of memory cells of the first physical page of memory cells.

In Example 13, the subject matter of Example 12, wherein determining the number of zeros stored in the XPs of the memory cells of the first physical page of memory cells comprises reading the values stored in the XPs of the first physical page of memory cells.

In Example 14, the subject matter of any of Examples 9-13, wherein determining whether to write dummy data to the first physical page comprises: comparing the determined number of zeros to a threshold; and writing dummy data to the first physical page of memory cells if the number of zeros exceeds the threshold.

In Example 15, the subject matter of Example 14, wherein the threshold is a function of the number of memory cells in the first physical page and the number of bits in the multiple memory cells.

In Example 16, the subject matter of any of Examples 9-15, wherein determining whether to write dummy data to the first physical page comprises: comparing the determined number of zeros to a threshold; and refraining from writing dummy data to the first physical page of memory cells if the number of zeros does not exceed the threshold.

Example 17 is at least one non-transitory device-readable storage medium comprising instructions that, when executed by a control circuitry of a storage system, cause the control circuitry to perform operations comprising: detecting an asynchronous power loss (APL) at the storage system; in response to the detected APL, determining a number of zeros stored in a first physical page of memory cells of the storage system; and determining whether to write dummy data to the first physical page using the determined number of zeros in the first physical page.

In Example 18, the subject matter of Example 17, wherein the operations further comprise, in response to the detected APL, detecting one or more fake programmed pages, wherein determining the number of zeros stored in the first physical page comprises in response to the detected one or more fake programmed pages, and wherein the first physical page of memory cells is one of the one or more detected fake programmed pages.

In Example 19, the subject matter of any of Examples 17-18, wherein detecting the APL comprises, upon resuming operation from a low-power state, detecting if such low-power state was an APL.

In Example 20, the subject matter of any of Examples 17-19, wherein each memory cell of the first physical page of memory cells comprises a lower page (LP), an upper page (UP), and an extra page (XP), wherein determining the number of zeros stored in the first physical page of memory cells comprises determining the number of zeroes stored in the XPs of the memory cells of the first physical page of memory cells, and wherein determining whether to write dummy data to the first physical page comprises determining whether to write dummy data to the XPs of memory cells of the first physical page of memory cells.

In Example 21, the subject matter of Example 20, wherein determining the number of zeros stored in the XPs of the memory cells of the first physical page of memory cells comprises reading the values stored in the XPs of the first physical page of memory cells.

In Example 22, the subject matter of any of Examples 17-21, wherein determining whether to write dummy data to the first physical page comprises: comparing the determined number of zeros to a threshold; and writing dummy data to the first physical page of memory cells if the number of zeros exceeds the threshold.

In Example 23, the subject matter of Example 22, wherein the threshold is a function of the number of memory cells in the first physical page and the number of bits in the multiple memory cells.

In Example 24, the subject matter of any of Examples 17-23, wherein determining whether to write dummy data to the first physical page comprises: comparing the determined number of zeros to a threshold; and refraining from writing dummy data to the first physical page of memory cells if the number of zeros does not exceed the threshold.

In Example 25, subject matter (e.g., a system or apparatus) may optionally combine any portion or combination of any portion of any one or more of Examples 1-24 to comprise "means for" performing any portion of any one or more of the functions or methods of Examples 1-24, or at least one "non-transitory machine-readable medium" including instructions that, when performed by a machine, cause the machine to perform any portion of any one or more of the functions or methods of Examples 1-24.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A storage system comprising:
at least one non-volatile memory device comprising multiple memory cells organized in physical pages, each memory cell comprising multiple pages, including a lower page (LP), an upper page (UP), and an extra page (XP); and
a controller coupled to the at least one non-volatile memory device, wherein instructions are stored in the storage system, wherein the instructions, when executed by the controller, cause the controller to perform operations, comprising:
in response to a detected asynchronous power loss (APL) at the storage system, determine a number of zeros stored in the XPs of a first, physical page of memory cells; and
determine whether to write dummy data to the first physical page using the determined number of zeros in the XPs of the first physical page.

2. The storage system of claim 1,
wherein, in response to the detected APL, the controller is configured to detect one or ore fake programmed pages, wherein the first physical page is a detected fake programmed page.

3. The storage system of claim 1,
wherein the controller is configured to detect, upon resuming operation from a low-power state, if such low-power state was an APL.

4. The storage system of claim 1,
wherein, to determine the number of zeros stored in the XPs of the memory cells of the first physical page of memory cells, the controller is configured to read values stored in the XPs of the first physical page of memory cells.

5. The storage system of claim 1,
wherein, to determine whether to write the dummy data to the first physical page, the controller is configured to compare the determined number of zeros stored in the XPs of the first physical page to a threshold, and
wherein the controller is configured to write the dummy data to the first physical page of memory cells if the determined number of zeros stored in the XPs of the first physical page is less than the threshold.

6. The storage system of claim 5,
wherein the threshold is a function of a number of memory cells in the first physical page and a number of bits in the multiple memory cells.

7. The storage system of claim 5,
wherein the threshold is between 37.5% and 50% of the number of memory cells in the first physical page.

8. The storage system of claim 7,
wherein the threshold is 45% of the number of memory cells in the first physical page.

9. The storage system of claim 1,
wherein, to determine whether to write the dummy data to the first physical page, the controller is configured to compare the determined number of zeros in the XPs of the first physical page to a threshold, and
wherein the controller is configured to refrain from writing the dummy data to the first physical page of memory cells if the determined number of zeros in the XPs of the first physical page exceeds the threshold.

10. A method implemented by controller of a storage system comprising at least one non-volatile memory device comprising multiple memory cells organized in physical pages, each memory cell comprising multiple pages, including a lower page (LP), an upper page (UP), and an extra page (XP), the method comprising:
detecting an asynchronous power loss (APL) at the storage system;
in response to the detected APL, determining a number of zeros stored in the XPs of a first physical page of memory cells of the storage system; and
determining whether to write dummy data to the first physical page using the determined number of zeros in the XPs of the first physical page.

11. The method of claim 10, comprising:
in response to the detected APL, detecting one or more fake programmed pages,
wherein determining the number of zeros stored in the XPs of the first physical page comprises in response to the detected one or more fake programmed pages, wherein the first physical page of memory cells is one of the one or more detected fake programmed pages.

12. The method of claim 10,
wherein detecting the APL comprises, upon resuming operation from a low-power state, detecting if such low-power state was an APL.

13. The method of claim 10,
wherein determining the number of zeros stored in the XPs of the memory cells of the physical page of memory cells comprises reading values stored in the XPs of the first physical page of memory cells.

14. The method of claim 10,
wherein determining whether to write the dummy data to the first physical page comprises:
comparing the determined number of zeros stored in the XPs of the first physical page to a threshold; and
writing the dummy data to the first physical page of memory cells if the determined number of zeros stored in the XPs of the first physical page is less than the threshold.

15. The method of claim 14,
wherein the threshold is a function of a number of memory cells in the first physical page and a number of bits in the multiple memory cells.

16. The method of claim 14,
wherein the threshold is between 37.5% and 50% of the number of memory cells in the first physical page.

17. The method of claim 16,
wherein the threshold is 45% of the number of memory cells in the first physical page.

18. The method of claim 10,
wherein determining whether to write the dummy data to the first physical page comprises:
comparing the determined number of zeros in the XPs of the first physical page to a threshold; and
refraining from writing the dummy data to the first physical page of memory cells if the determined number of zeros in the XPs of the first physical page exceeds the threshold.

19. At least one non-transitory device-readable storage medium comprising instructions that, when executed by a controller of a storage system comprising at least one non-volatile memory device comprising multiple memory cells organized in physical pages, each memory cell comprising multiple pages, including a lower page (LP), an upper page (UP), and an extra page (XP), cause the controller to perform operations comprising:
detecting an asynchronous power loss (APL) at the storage system;
in response to the detected APL, determining a number of zeros stored in the XPs of a first physical page of memory cells of the storage system; and
determining whether to write dummy data to the first physical page using the determined number of zeros in the XPs of the first physical page.

20. The at least one device-readable storage medium of claim 19,
wherein determining whether to write the dummy data to the first physical page comprises:
comparing the determined number of zeros stored in the XPs of the first physical page to a threshold; and
writing the dummy data to the first physical page of memory cells if the determined number of zeros stored in the XPs of the first physical page is less than the threshold,
wherein the threshold is between 37.5% and 50% of the number of memory cells in the first physical page.

* * * * *